(12) United States Patent
Shen

(10) Patent No.: US 7,427,805 B2
(45) Date of Patent: Sep. 23, 2008

(54) LIGHT-EMITTING DIODE CHIP PACKAGE BODY AND PACKAGING METHOD THEREOF

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 462 days.

(21) Appl. No.: 10/944,758

(22) Filed: Sep. 21, 2004

(65) Prior Publication Data
US 2005/0077529 A1    Apr. 14, 2005

(30) Foreign Application Priority Data
Oct. 14, 2003    (TW)    ............... 92128459 A

(51) Int. Cl.
H01L 21/48    (2006.01)
H01L 21/02    (2006.01)
H01L 21/44    (2006.01)
H01L 41/00    (2006.01)

(52) U.S. Cl. ............ 257/680; 257/778; 257/779; 438/106; 310/313

(58) Field of Classification Search ............... 257/680, 257/778–780; 310/313; 438/108, 100
See application file for complete search history.

(56) References Cited

U.S. PATENT DOCUMENTS

| 6,674,159 B1* | 1/2004 | Peterson et al. ............ 257/680 |
| 2001/0009342 A1* | 7/2001 | Furukawa et al. ........ 310/313 A |
| 2005/0023550 A1* | 2/2005 | Eliashevich et al. ........... 257/99 |

* cited by examiner

Primary Examiner—Howard Weiss
Assistant Examiner—Steven H Rao
(74) Attorney, Agent, or Firm—Rosenberg, Klein & Lee

(57) ABSTRACT

An LED chip package body includes an LED chip having a pad-installed surface, a plurality of pads installed on the pad-installed surface and a rear surface formed on an opposite side of the pad-installed surface. A light-reflecting coating is disposed on the pad-installed surface and has a plurality of exposed holes for exposure of the corresponding pads. A first insulative layer is formed on the light-reflecting coating and has a plurality of through holes communicating with the corresponding exposed holes. A second insulative layer is disposed on the rear surface and has a central through hole for exposure of a central portion of the rear surface. A lens is received in the central through hole. Each of a plurality of external connected conductive bodies is electrically connected to the corresponding pad and projects out of the corresponding through hole in the first insulative layer.

18 Claims, 8 Drawing Sheets

LIGHT-EMITTING DIODE CHIP PACKAGE BODY AND PACKAGING METHOD THEREOF

BACKGROUND OF THE INVENTION

1. Field of the Invention

The present invention relates to a light-emitting diode chip, and especially to a light-emitting diode chip package body and a packaging method of the light-emitting diode chip package body.

2. Description of the Related

In general, the LED (Light-emitting diode) of prior art comprises a package substrate and/or an electric conduction frame and an LED chip disposed on the package substrate and/or the electric conduction frame. The LED chip has a plurality of pads electrically connected to corresponding joining points of the package substrate and/or the electric conduction through corresponding metal wires by wire bonding process. However, the packaging process according to the above packaging method wastes time. Thus, the output and the quality of the LED chip package body will not improve.

Furthermore, the size of the LED is increasingly small with the advancement of the chip process and the area of the pad of the LED chip is increasingly small. Thus, it is hard to carry out the wire bonding process on the small area of the pad.

With the employment of unique considerations and application of theories, and based on several years experience in specialized production of all flexible assembly systems and mechanisms, the inventor has come up with an innovative light-emitting diode chip package body.

SUMMARY OF THE INVENTION

The primary object of the present invention is to provide a light-emitting diode chip package body and a packaging method of the light-emitting diode chip package body. The light-emitting diode chip package body and the packaging method of the light-emitting diode chip package body are used to resolve the problems of the pad of the LED chip of the prior art.

In order to achieve the above objects, the present invention provides a light-emitting diode chip package body, comprising: a light-emitting diode chip having a pad-installed surface formed thereon, a plurality of pads installed on the pad-installed surface and a rear surface formed on an opposite side of the pad-installed surface; a light-reflecting coating disposed on the pad-installed surface and having a plurality of exposed holes for exposure of the corresponding pads of the light-emitting diode; a first insulative layer formed on the light-reflecting coating and having a plurality of through holes communicating with the corresponding exposed holes of the light-reflecting coating; a second insulative layer disposed on the rear surface of the light-emitting diode chip and having a central through hole for exposure of a central portion of the rear surface; a lens received in the central through hole of the second insulative layer; and a plurality of external connected conductive bodies, each of the external connected conductive bodies electrically connected to the corresponding pad of the light-emitting diode chip and projecting out of the corresponding through hole of the first insulative layer.

In order to achieve the above objects, the present invention provides a light-emitting diode chip package body, comprising: a light-emitting diode chip having a pad-installed surface formed thereon, a plurality of pads installed on the pad-installed surface and a rear surface formed on an opposite side of the pad-installed surface; a light-reflecting coating disposed on the rear surface of the light-emitting diode chip; a first insulative layer formed on the light-reflecting coating; a second insulative layer disposed on the pad-installed surface of the light-emitting diode chip and having a central through hole for exposure of a central portion of the pad-installed surface and a plurality of exposed through holes for exposure of the corresponding pads; a lens received in the central through hole of the second insulative layer; and a plurality of external connected conductive bodies, each of the external connected conductive bodies electrically connected to the corresponding pad of the light-emitting diode chip and projecting out of the corresponding through hole of the first insulative layer.

In order to achieve the above objects, the present invention provides a packaging method for a light-emitting diode chip package body, the packaging method comprising: providing a light-emitting diode chip having a pad-installed surface formed thereon, a plurality of pads installed on the pad-installed surface and a rear surface formed on an opposite side of the pad-installed surface; forming a light-reflecting coating on the pad-installed surface, the light-reflecting coating having a plurality of exposed holes for exposure of the corresponding pads of the light-emitting diode; forming a first insulative layer on the light-reflecting coating, the first insulative layer having a plurality of through holes communicating with the corresponding exposed holes of the light-reflecting coating; forming a second insulative layer on the rear surface of the light-emitting diode chip, the second insulative layer having a central through hole for exposure of a central portion of the rear surface; setting a lens received in the central through hole of the second insulative layer; and setting a plurality of external connected conductive bodies, each of the external connected conductive bodies being electrically connected to the corresponding pad of the light-emitting diode chip and projecting out of the corresponding through hole of the first insulative layer.

In order to achieve the above objects, the present invention provides a packaging method of a light-emitting diode chip package body, the packaging method comprising: providing a light-emitting diode chip having a pad-installed surface formed thereon, a plurality of pads installed on the pad-installed surface and a rear surface formed on an opposite side of the pad-installed surface; forming a light-reflecting coating on the rear surface of the light-emitting diode chip; forming a first insulative layer on the light-reflecting coating; forming a second insulative layer on the pad-installed surface of the light-emitting diode chip, the second isolative layer having a central through hole for exposure of a central portion of the pad-installed surface and a plurality of exposed through holes for exposure of the corresponding pads; setting a lens received in the central through hole of the second insulative layer; and setting a plurality of external connected conductive bodies, each of the external connected conductive bodies being electrically connected to the corresponding pad of the light-emitting diode chip and projecting out of the corresponding through hole of the first insulative layer.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawing, in which.

DETAILED DESCRIPTION OF PREFERRED EMBODIMENTS

Referring to FIGS. 1 to 7, the first embodiment of the present invention provides an LED chip package and a packaging method of the LED chip package.

Figure 1:
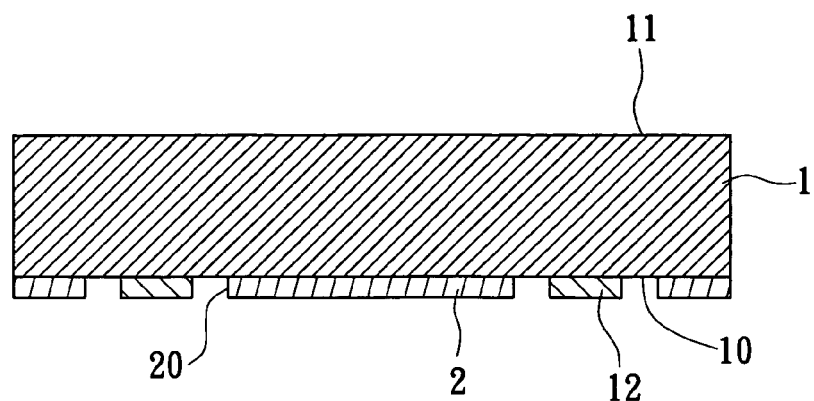
FIGS. 1 to 7 are schematic views of the LED chip package body according to the steps of the first embodiment of the present invention.
Figure 2:
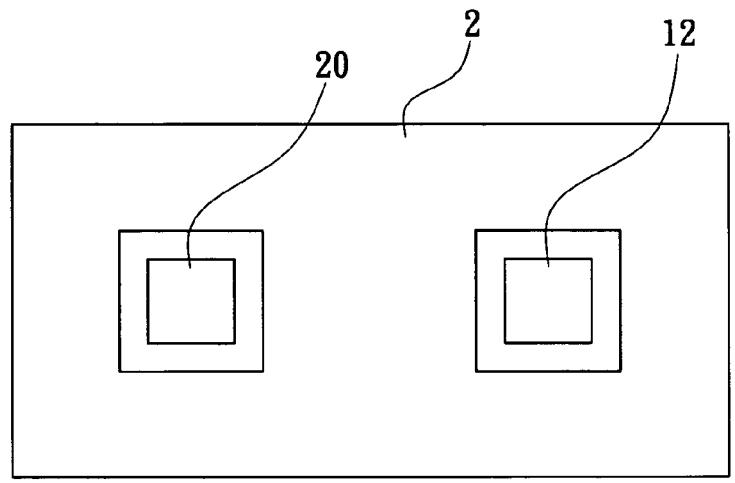

Referring to FIGS. 1 and 2, the steps of the first embodiment provide a light-emitting diode (LED) chip 1. The LED chip 1 has a pad-installed surface 10, a plurality of pads 12 disposed on the pad-installed surface 10 and a rear surface 11 disposed opposite the pad-installed surface 10.

The steps of the first embodiment comprise forming a light-reflecting coating 2 on the pad-installed surface 10 of the LED chip 1. The light-reflecting coating 2 has a plurality of exposed holes 20 for exposure of the corresponding pads 12.

Figure 3:
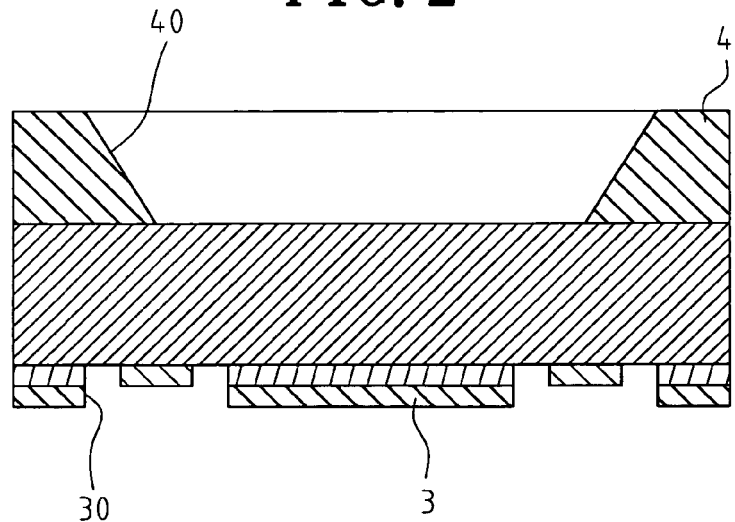

Referring to FIG. 3, the steps of the first embodiment comprise forming a first insulative layer 3 on the light-reflecting coating 2. The first insulative layer 3 is made of photoresist material like sensitization printing ink. After the first insulative layer 3 is formed on the light-reflecting coating 2, a plurality of through holes 30 are formed in the first insulative layer 3 by etching. The through holes 30 communicate with the corresponding exposed holes 20 of the light-reflecting coating 2. Each of the through holes 30 communicate with the corresponding exposed hole 20 to form a conductive receiving space.

Then, the steps of the first embodiment comprise forming a second insulative layer 4 on the rear surface 11 of the LED chip 1. The second insulative layer 4 is made of photoresist material like sensitization printing ink. After the second insulative layer 4 is formed on the rear surface 11 of the LED chip 1, a central through hole 40 is formed on a central portion of the second insulative layer 4 by an etching process for exposure of a central portion of the rear surface 11 of the LED chip 1.

Figure 4:
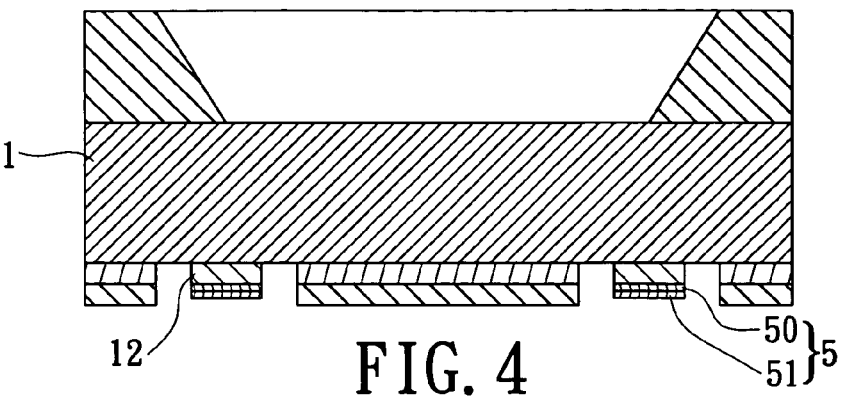

Referring to FIG. 4, the steps of the first embodiment comprise forming an electroplated metal layer 5 on each of the corresponding pads 12 of the LED chip 1. The electroplated metal layer 5 is composed of a nickel layer 50 and a gold layer 51

Figure 5:
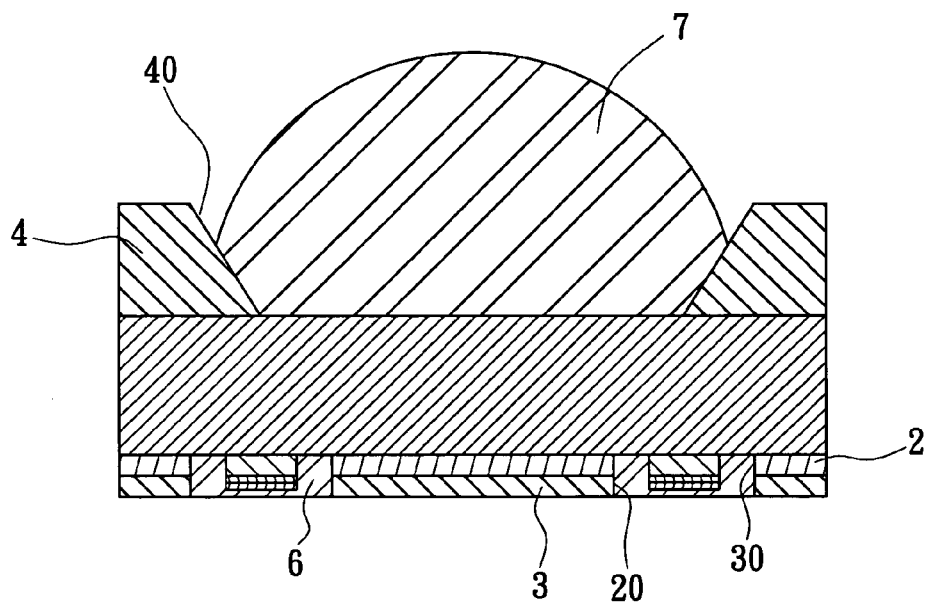

Referring to FIG. 5, the steps of the first embodiment comprise setting an intermediary conductive body 6 made of conductive grease and received in each of the corresponding conductive body receiving spaces. The conductive grease has a silver powder doped therein.

Then, the steps of the first embodiment further comprise setting a lens 7 in the central through hole 40 of the second insulative layer 4. The lens 7 is made of a polyimide or any suitable material and has a cambered top portion.

Also, the lens 7 has a light-polarizing compound with a different wavelength doped therein to provide light passing through the lens 7 with a good color.

Figure 6:
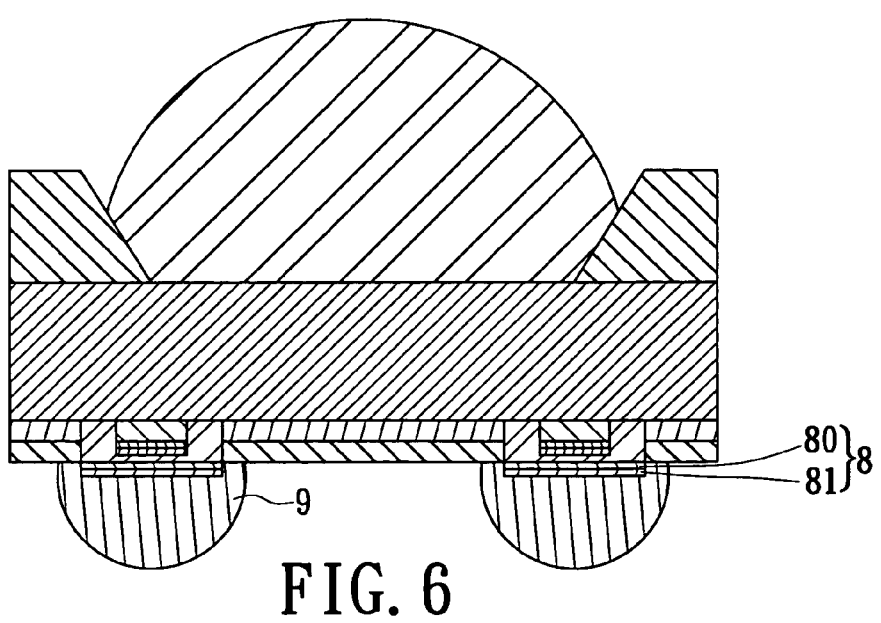
Figure 7:
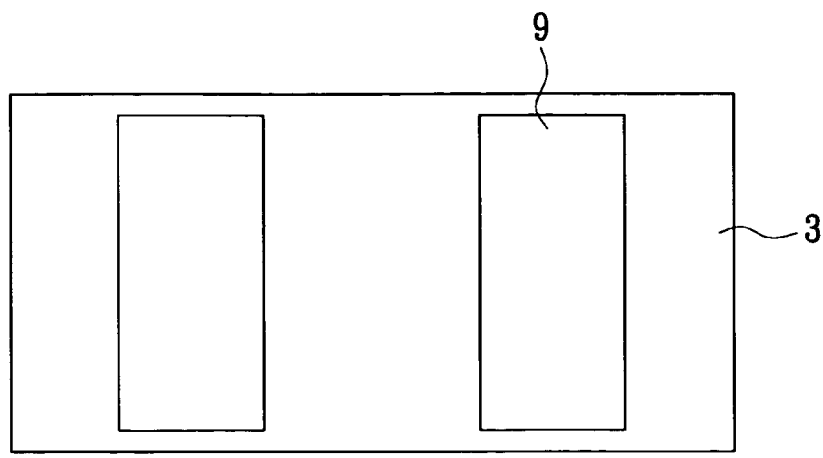

Referring to FIGS. 6 and 7, the steps of the first embodiment comprise forming a metal connected layer 8 on a surface of each of the corresponding intermediary conductive bodies 6. The metal connected layer 8 is composed of a nickel layer 80 and a gold layer 81.

Finally, an external connected conductive body 9 is set on each of the metal connected layers 8. Each of the external connected conductive bodies 9 extends outwardly a predetermined distance away from a surface of the first insulative layer 3.

The above LED chip package and packaging method of the LED chip package body have some advantages, comprising:
1. The size of the LED chip package body is same as that of the LED chip 1.
2. The packaging method of the LED chip package body is made without a wire bonding process, so that the output and the quality of the LED chip package body are improved.
3. It is easy to assemble the LED chip package body, because the external connected conductive body 9 extends from the surface of the first insulative layer 3.

Figure 8:
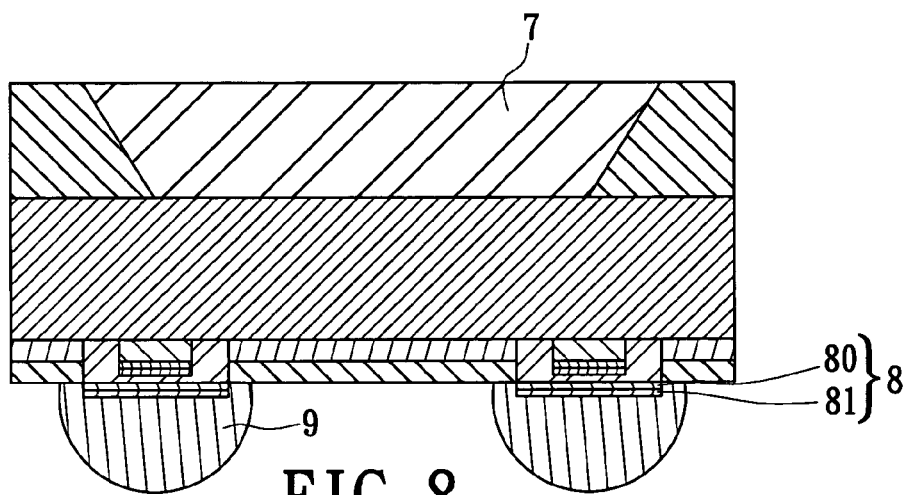
FIG. 8 is a schematic, cross-sectional view of the LED chip package body according to the second embodiment of the present invention.

Referring to FIG. 8, the second embodiment of the present invention provides an LED chip package. The second embodiment comprises a lens 7 with a planar top portion provided by a grinding process, which is different from the first embodiment.

Figure 9:
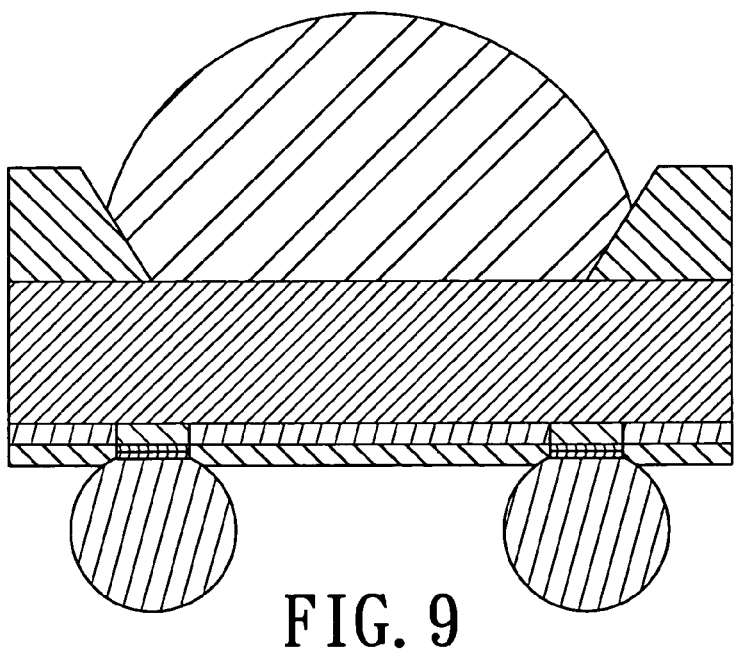
FIGS. 9 and 10 are schematic views of the LED chip package body according to the third embodiment of the present invention.
Figure 10:
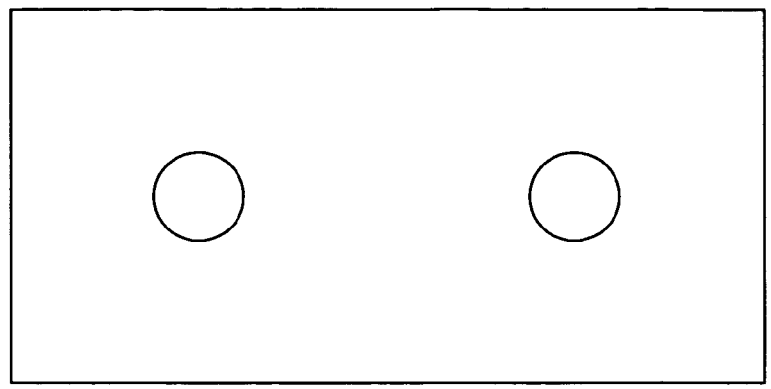

Referring to FIGS. 9 and 10, the third embodiment of the present invention provides an LED chip package. The third embodiment comprises a lens 7 received in the central through hole 40 of the second insulative layer 4 and a plurality of external connected conductive bodies 9 electrically connected to the corresponding electroplated metal layer 5. Each of the external connected conductive bodies 9 projects out of the through hole 30 of the first insulative layer 3.

Figure 11:
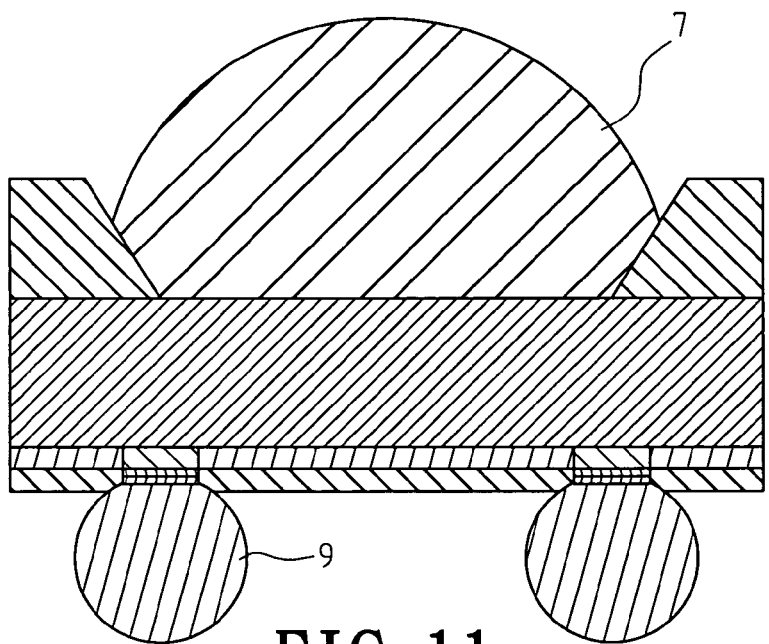
FIG. 11 is a schematic, cross-sectional view of the LED chip package body according to the fourth embodiment of the present invention.

Referring to FIG. 11, the fourth embodiment of the present invention provides an LED chip package. The fourth embodiment comprises a lens 7 ground to form a planar side portion by a grinding process.

Referring to FIGS. 12 to 17, the fifth embodiment of the present invention provides an LED chip package and a packaging method of the LED chip package.

Figure 12:
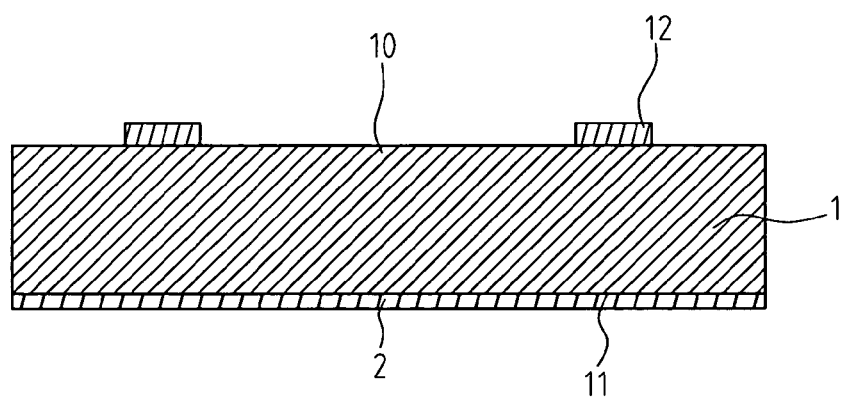
FIGS. 12 to 17 are schematic views of the LED chip package body according to the steps of the fifth embodiment of the present invention.

Referring to FIG. 12, the steps of the fifth embodiment provide a light-emitting diode (LED) chip 1. The LED chip 1 has a pad-installed surface 10, a plurality of pads 12 disposed on the pad-installed surface 10 and a rear surface 11 disposed opposite the pad-installed surface 10.

The steps of the first embodiment comprise forming a light-reflecting coating 2 on the rear surface 11 of the LED chip 1.

Figure 13:
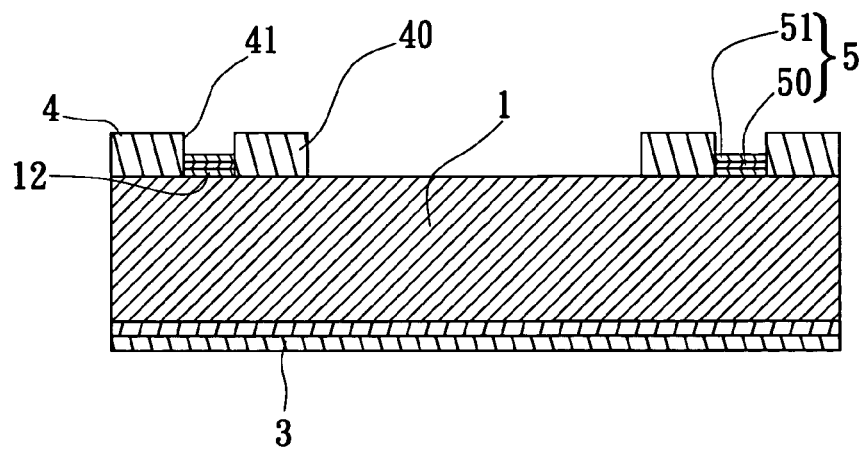
Figure 14:
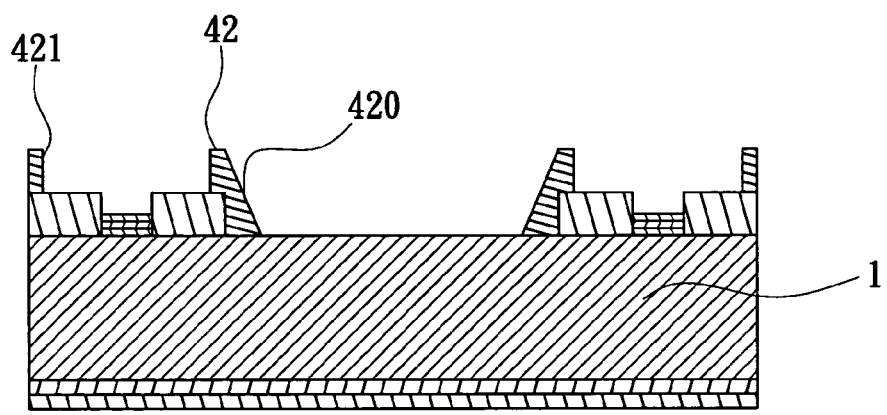

Referring to FIG. 13, the steps of the fifth embodiment comprise forming a first insulative layer 3 on the light-reflecting coating 2. The first insulative layer 3 is made of photoresist material like sensitization printing ink.

The steps of the fifth embodiment comprise forming a second insulative layer 4 on the pad-installed surface 10 of the LED chip 1. The second insulative layer 4 is made of photoresist material like sensitization printing ink. After the second insulative layer 4 is formed on the pad-installed surface 10 of the LED chip 1, a central through hole 40 is formed in a central portion of the second insulative layer 4 by etching for exposure of a central portion of the pad-installed surface 10 of the LED chip 1 and a plurality of exposed through holes is formed for exposure of the corresponding pads 12 of the LED chip 1.

The steps of the fifth embodiment further comprise forming an electroplated metal layer 5 on each of the corresponding pads 12 of the LED chip 1. The electroplated metal layer 5 is composed of a nickel layer 50 and a gold layer 51

The steps of the first embodiment further comprise forming a third insulative layer 42 on the second insulative layer 4. The third insulative layer 42 is made of photoresist material like sensitization printing ink. After the third insulative layer 42 is formed on the second insulative layer 4, a receiving hole 420 is formed by etching for exposure of a central portion of the pad-installed surface 10 of the LED chip 1 and a plurality of exposed open holes are formed communicating with the corresponding exposed through holes 41 of the second insulative layer 4. Each of the exposed open holes 421 communicates with the corresponding exposed through hole 41 to form a conductive receiving space.

Figure 15:
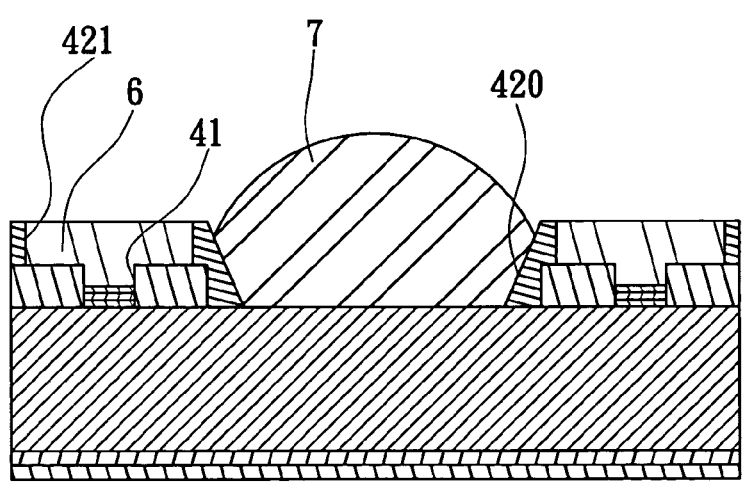

Referring to FIG. 15, the steps of the first embodiment comprise setting an intermediary conductive body 6 made of conductive grease and received in each of the corresponding conductive body receiving spaces.

The steps of the fifth embodiment further comprise setting a lens 7 in the receiving hole 420 of the third insulative layer 42. The lens 7 is made of a polyimide or any suitable material and has a cambered top portion.

Figure 16:
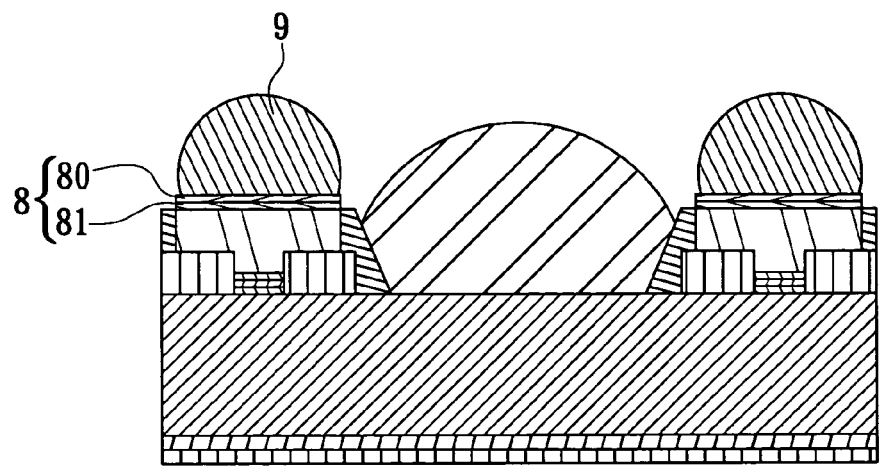
Figure 17:
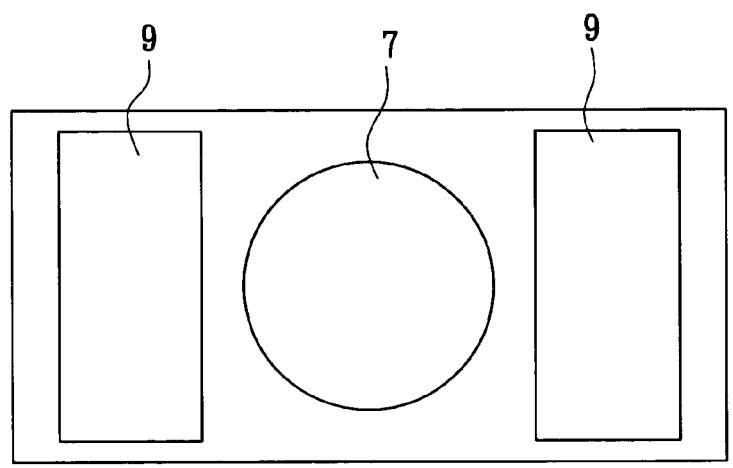

Referring to FIGS. 16 and 17, the steps of the fifth embodiment comprise forming a metal connected layer 8 on a surface of each of the corresponding intermediary conductive bodies 6. The metal connected layer 8 is composed of a nickel layer 80 and a gold layer 81.

Finally, setting an external connected conductive body 9 is disposed on each of the metal connected layers 8. Each of the external connected conductive bodies 9 extends outwardly a predetermined distance away from a surface of the third insulative layer 42.

Figure 18:
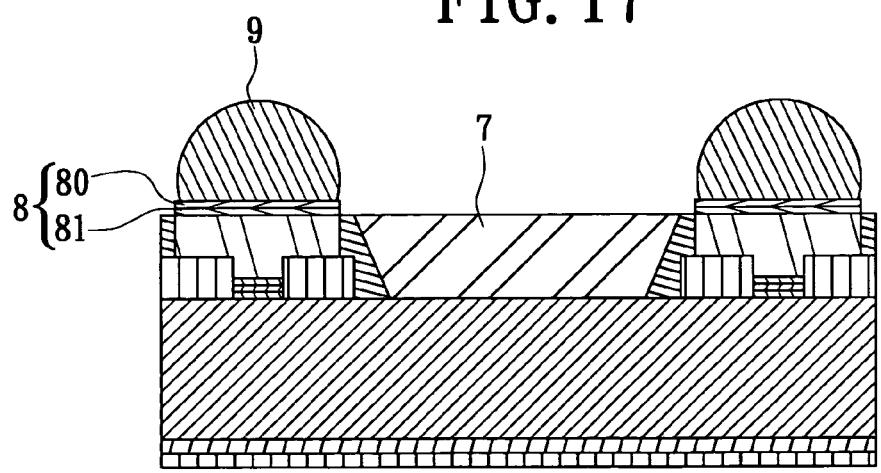
FIG. 18 is a schematic, cross-sectional view of according to the sixth embodiment of the present invention.

Referring to FIG. 18, the sixth embodiment of the present invention provides an LED chip package. The sixth embodiment comprises a lens 7 having a planar top portion formed by a grinding process, which is different from the first embodiment.

Figure 19:
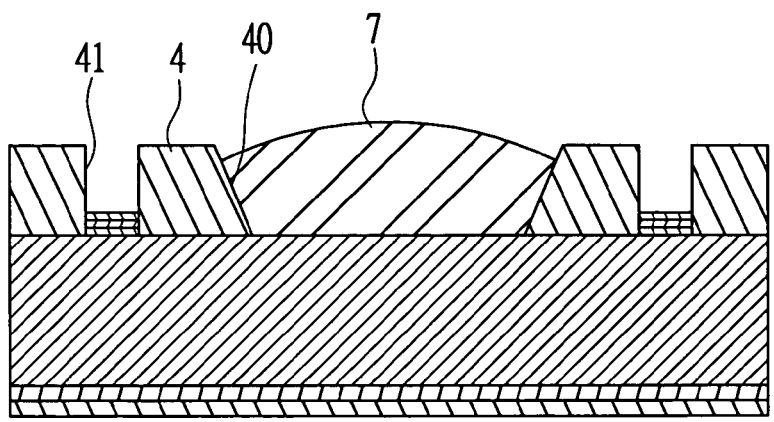
FIGS. 19 to 21 are schematic views of the LED chip package body according to the seventh embodiment of the present invention.
Figure 20:
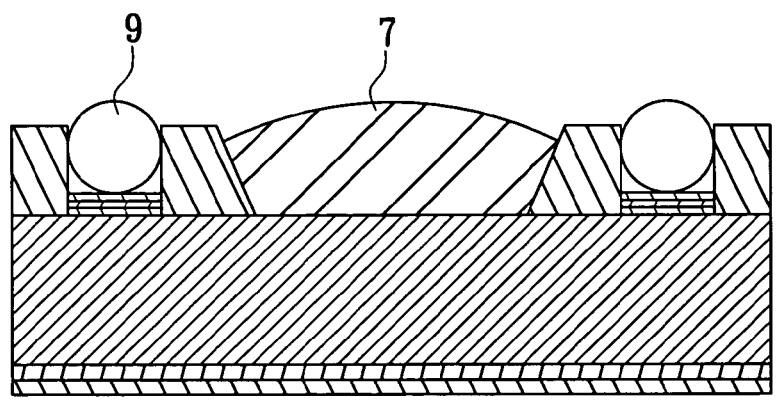
Figure 21:
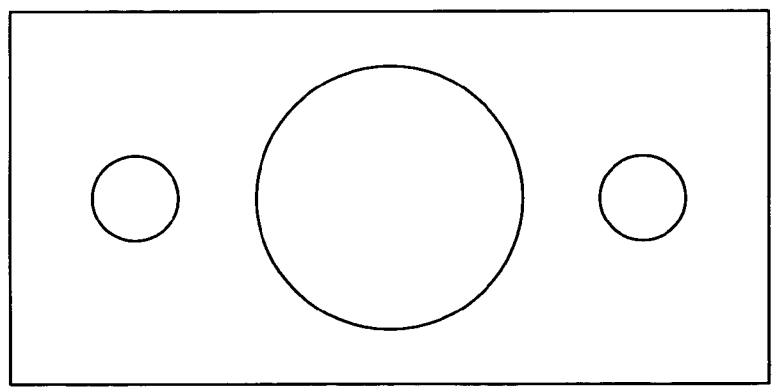

Referring to FIGS. 19 to 21, the seventh embodiment of the present invention provides an LED chip package and a packaging method of the LED chip package.

Referring to FIGS. 19 to 21, the steps of the fifth embodiment provide a light-emitting diode (LED) chip 1. The LED chip 1 has a pad-installed surface 10, a plurality of pads 12 disposed on the pad-installed surface 10 and a rear surface 11 disposed opposite the pad-installed surface 10.

The steps of the first embodiment comprise forming a light-reflecting coating 2 on the rear surface 11 of the LED chip 1.

The steps of the fifth embodiment comprise forming a first insulative layer 3 on the light-reflecting coating 2 and a second insulative layer 4 on the pad-installed surface 10 of the LED chip 1. The second insulative layer 4 forms a central through hole 40 by an etching process for exposure of a central portion of the pad-installed surface 10 of the LED chip 1 and forms a plurality of exposed through holes for exposure of the corresponding pads 12 of the LED chip 1.

Then, the steps of the seventh embodiment further comprise forming an electroplated metal layer 5 on each of the corresponding pads 12 of the LED chip 1. The electroplated metal layer 5 is composed of a nickel layer 50 and a gold layer 51

Then, the steps of the seventh embodiment further comprise setting a lens 7 in the central through hole 40 of the second insulative layer 4 and setting an external connected conductive body 9 on the metal connected layers 8 of each of the pads 12. Each of the external connected conductive bodies 9 extends outwardly out of the exposed through hole 41 of the second insulative layer 4.

Figure 22:
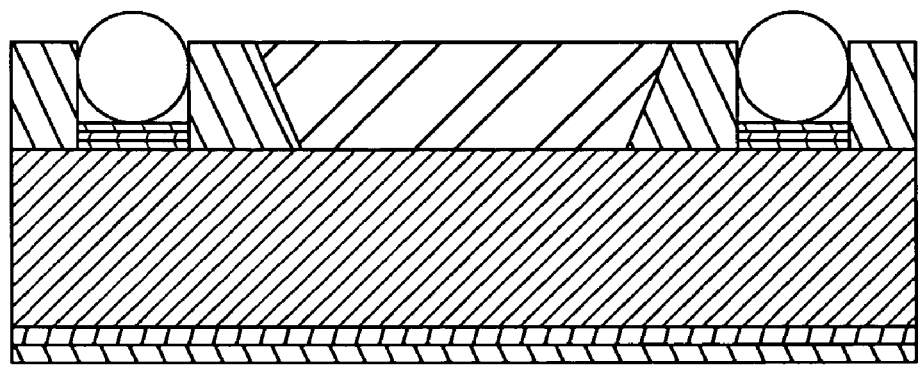
FIG. 22 is a schematic, cross-sectional view of the LED chip package body according to the eighth embodiment of the present invention.

Referring to FIG. 22, the eighth embodiment of the present invention provides an LED chip package. The eighth embodiment comprises a lens 7 having a planar top portion formed by a grinding process, which is different from the seventh embodiment.

Figure 23:
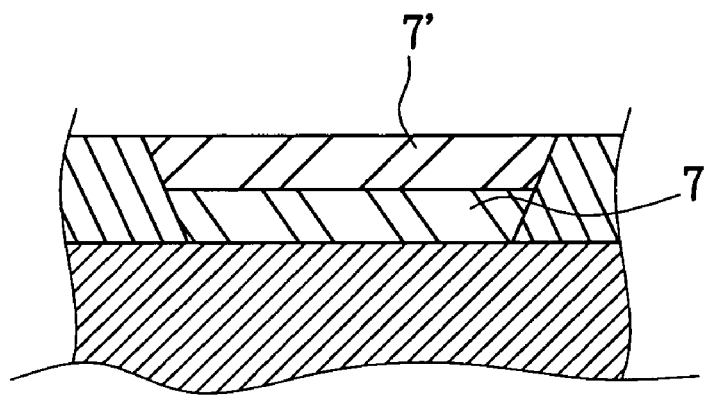
FIG. 23 is a schematic, cross-sectional view of the LED chip package body according to the ninth embodiment of the present invention.

Referring to FIG. 23, the ninth embodiment of the present invention provides an LED chip package. The second, fourth, sixth and eighth embodiments further comprise setting a second lens 7' on the lens 7. The lens 7 and the second lens 7' have a light-polarizing compound with a different wavelength doped therein to provide light passing through the second lens 7' with a good mixing color.

Although the present invention has been described with reference to the preferred embodiment thereof, it will be understood that the invention is not limited to the details thereof. Various substitutions and modification have suggested in the foregoing description, and other will occur to those of ordinary skill in the art. Therefore, all such substitutions and modifications are intended to be embraced within the scope of the invention as defined in the appended claims.

What is claimed is:

1. A light-emitting diode chip package body, comprising:
a light-emitting diode chip having a pad-installed surface formed thereon, a plurality of pads installed on the pad-installed surface and a rear surface formed on an opposite side of the pad-installed surface;
a light-reflecting coating disposed on the pad-installed surface and having a plurality of exposed holes for exposure of the corresponding pads of the light-emitting diode;
a first insulative layer formed on the light-reflecting coating and having a plurality of through holes communicating with the corresponding exposed holes of the light-reflecting coating;
a second insulative layer disposed on the rear surface of the light-emitting diode chip and having a central through hole for exposure of a central portion of the rear surface;
a lens received in the central through hole of the second insulative layer; and
a plurality of external connected conductive bodies, each of the external connected conductive bodies electrically connected to the corresponding pad of the light-emitting diode chip and projecting out of the corresponding through hole of the first insulative layer.

2. The package body as claimed in claim 1, wherein the lens has a cambered top portion.

3. The package body as claimed in claim 1, wherein the lens has a planar top portion.

4. A light-emitting diode chip package body, comprising:
a light-emitting diode chip having a pad-installed surface formed thereon, a plurality of pads installed on the pad-installed surface and a rear surface formed on an opposite side of the pad-installed surface;
a light-reflecting coating disposed on the rear surface of the light-emitting diode chip;
a first insulative layer formed on the light-reflecting coating;
a second insulative layer disposed on the pad-installed surface of the light-emitting diode chip and having a central through hole for exposure of a central portion of the pad-installed surface and a plurality of exposed through holes for exposure of the corresponding pads;
a lens received in the central through hole of the second insulative layer; and a plurality of external connected conductive bodies, each of the external connected conductive bodies being electrically connected to the corresponding pad of the light-emitting diode chip and projecting out of the corresponding through hole of the second insulative layer.

5. The package body as claimed in claim 4, wherein the lens has a cambered top portion.

6. The package body as claimed in claim 4, wherein the lens has a planar top portion.

7. The package body as claimed in claim 6, further comprising a second lens disposed on the top portion of the lens, both the lens and the second lens having a light-polarizing compound with different wavelengths doped therein.

8. The package body as claimed in claim 4, further comprising a plurality of electroplated metal layers formed on the corresponding pads of the light-emitting diode chip, wherein each is composed of a nickel layer and a gold layer, and each of the pads is electrically connected to the corresponding external connected conductive body by the corresponding electroplated metal layer.

9. The package body as claimed in claim 4, further comprising a third insulative layer formed on the second insulative layer, the third insulative layer having a receiving bole for exposure of the central portion of the pad-installed surface of the light-emitting diode chip and a plurality of exposed open holes communicating with the corresponding exposed through holes, and further comprising a conductive body receiving space formed between the corresponding exposed open hole and the corresponding exposed though hole, and a plurality of intermediary conductive bodies received in the corresponding conductive body receiving space for each of the pads to connect electrically to the corresponding external connected conductive body by the corresponding intermediary conductive body.

10. The package body as claimed in claim 9, wherein the intermediary conductive body is made of conductive grease.

11. The package body as claimed in claim 9, further comprising a plurality of metal connected layers farmed on a surface of-the corresponding intermediary conductive bodies, wherein each is composed of a nickel layer and a gold layer, and each of the intermediary conductive layers is electrically connected to the corresponding external connected conductive body by the corresponding metal connected layer.

12. The package body as claimed in claim 9, wherein each of the external connected conductive bodies extends outwardly a predetermined distance away from a surface of the first insulative layer.

13. A light-emitting diode chip package body, comprising:
a light-emitting diode chip having a pad-installed surface formed thereon, a plurality of pads installed on the pad-installed surface and a rear surface formed on an opposite side of the pad-installed surface;
a light-reflecting coating disposed on the pad-installed surface and having a plurality of exposed holes for exposure of the corresponding pads of the light-emitting diode;
a first insulative layer formed on the light-reflecting coating and having a plurality of through holes communicating with the corresponding exposed holes of the light-reflecting coating;
a second insulative layer disposed on the rear surface of the light-emitting diode chip and having a central through hole for exposure of a central portion of the rear surface;
a lens having a planar top portion received in the central through hole of the second insulative layer;
a second lens disposed on the top portion of the lens, both the lens and the second lens being doped with light-polarizing compounds with different wavelengths; and
a plurality of external connected conductive bodies, each of the external connected conductive bodies electrically connected to the corresponding pad of the light-emitting diode chip and projecting out of the corresponding through hole of the first insulative layer.

14. A light-emitting diode chip package body, comprising:
a light-emitting diode chip having a pad-installed surface formed thereon, a plurality of pads installed on the pad-installed surface and a rear surface formed on an opposite side of the pad-installed surface;
a light-reflecting coating disposed on the pad-installed surface and having a plurality of exposed holes for exposure of the corresponding pads of the light-emitting diode;
a first insulative layer formed on the light-reflecting coating and having a plurality of through boles communicating with the corresponding exposed holes of the light-reflecting coating;
a second insulative layer disposed on the rear surface of the light-emitting diode chip and having a central trough hole for exposure of a central portion of the rear surface;
a lens received in the central through hole of the second insulative layer;
a plurality of external connected conductive bodies, each of the external connected conductive bodies electrically connected to the corresponding pad of the light-emitting diode chip and projecting out of the corresponding through hole of the first insulative layer; and,
a plurality of electroplated metal layers formed on the corresponding pads of the light-emitting diode chip, wherein each is composed of a nickel layer and a gold layer, and each of the pads is electrically connected to the corresponding external connected conductive body by the corresponding electroplated metal layer.

15. A light-emitting diode chip package body, comprising:
a light-emitting diode chip having, a pad-installed surface formed thereon, a plurality of pads installed on the pad-installed surface and a rear surface formed on an opposite side of the pad-installed surface;
a light-reflecting coating disposed on the pad-installed surface and having a plurality of exposed holes for exposure of the corresponding pads of the light-emitting diode;
a first insulative layer formed on the light-reflecting coating and having a plurality of through holes communicating with the corresponding exposed boles of the light-reflecting coating;

a second insulative layer disposed on the rear surface of the light-emitting diode chip and having a central through hole for exposure of a central portion of the rear surface;

a lens received in the central through hole of the second insulative layer;

a plurality of external connected conductive bodies, each of the external connected conductive bodies electrically connected to the corresponding pad of the light-emitting diode chip and projecting out of the corresponding through hole of the first insulative layer; and, a conductive body receiving space formed between the corresponding exposed hole and the corresponding through hole, and a plurality of intermediary conductive bodies received in the corresponding conductive body receiving space for each of the pads to connect electrically to the corresponding external connected conductive body by the corresponding intermediary conductive body.

16. The package body as claimed in claim 15, wherein the intermediary conductive body is made of conductive grease.

17. A light-emitting diode chip package body, comprising:

a light-emitting diode chip having a pad-installed surface formed thereon, a plurality of pads installed on the pad-installed surface and a rear surface formed on an opposite side of the pad-installed surface;

a light-reflecting coating disposed on the pad-installed surface and having a plurality of exposed holes for exposure of the corresponding pads of the light-emitting diode;

a first insulative layer formed on the light-reflecting coating and having a plurality of through holes communicating with the corresponding exposed holes of the light-reflecting coating;

a second insulative layer disposed on the rear surface of the light-emitting diode chip and having a central through hole for exposure of a central portion of the rear surface;

a lens received in the central trough hole of the second insulative layer;

a plurality of external connected conductive bodies, each of the external connected conductive bodies electrically connected to the corresponding pad of the light-emitting diode chip and projecting out of the corresponding through hole of the first insulative layer;

a conductive body receiving space formed between the corresponding exposed hole and the corresponding through hole, and a plurality of intermediary conductive bodies received in the corresponding conductive body receiving space for each of the pads to connect electrically to the corresponding external connected conductive body by the corresponding intermediary conductive body; and, a plurality of metal connected layers formed on a surface of the corresponding intermediary conductive bodies, wherein each is composed of a nickel layer and a gold layer, and each of the intermediary conductive layers is electrically connected to the corresponding external connected conductive body by the corresponding metal connected layer.

18. A light-emitting diode chip package body, comprising:

a light-emitting diode chip having a pad-installed surface formed thereon, a plurality of pads installed on the pad-installed surface and a rear surface formed on an opposite side of the pad-installed surface;

a light-reflecting coating disposed on the pad-installed surface and having a plurality of exposed holes for exposure of the corresponding pads of the light-emitting diode;

a first insulative layer formed on the light-reflecting coating and having a plurality of through holes communicating with the corresponding exposed holes of the light-reflecting coating;

a second insulative layer disposed on the rear surface of the light-emitting diode chip and having a central trough hole for exposure of a central portion of the rear surface;

a lens received in the central through hole of the second insulative layer;

a plurality of external connected conductive bodies, each of the external connected conductive bodies electrically connected to the corresponding pad of the light-emitting diode chip and projecting out of the corresponding through hole of the first insulative layer;

a conductive body receiving space formed between the corresponding exposed hole and the corresponding through bole, and a plurality of intermediary conductive bodies received in the corresponding conductive body receiving space for each of the pads to connect electrically to the corresponding external connected conductive body by the corresponding intermediary conductive body, wherein each of the external connected conductive bodies extends outwardly a predetermined distance away from a surface of the first insulative layer.

* * * * *

UNITED STATES PATENT AND TRADEMARK OFFICE
CERTIFICATE OF CORRECTION

PATENT NO. : 7,427,805 B2  Page 1 of 1
APPLICATION NO. : 10/944758
DATED : September 23, 2008
INVENTOR(S) : Ming-Tung Shen It is certified that error appears in the above-identified patent and that said Letters Patent is hereby corrected as shown below:

On the Title Pg

For item (76) on the face of the patent, the inventorship data should read as follows:

-- Ming-Tung Shen, No. 60, Lane 328, Li-Shan Street, Nei-Hu Dist., Taipei City (TW) --

Signed and Sealed this

Twenty-third Day of February, 2010

David J. Kappos
*Director of the United States Patent and Trademark Office*